United States Patent
Yang

(10) Patent No.: US 10,650,896 B1
(45) Date of Patent: May 12, 2020

(54) PRE-READ TECHNIQUE FOR MULTI-PASS PROGRAMMING OF FLASH MEMORY

(71) Applicant: Yangtze Memory Technologies Co., Ltd., Wuhan, Hubei Province (CN)

(72) Inventor: Xin Yang, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 15 days.

(21) Appl. No.: 16/243,048

(22) Filed: Jan. 8, 2019

Related U.S. Application Data

(63) Continuation of application No. PCT/CN2018/120030, filed on Dec. 10, 2018.

(51) Int. Cl.
*G11C 7/10* (2006.01)
*G11C 16/10* (2006.01)
*G11C 16/04* (2006.01)
*G11C 16/26* (2006.01)

(52) U.S. Cl.
CPC .......... *G11C 16/10* (2013.01); *G11C 16/0483* (2013.01); *G11C 16/26* (2013.01); *G11C 2216/14* (2013.01)

(58) Field of Classification Search
CPC .................................................... G11C 7/1006
USPC ..................................................... 365/185.18
See application file for complete search history.

(56) References Cited

U.S. PATENT DOCUMENTS

| | | | |
|---|---|---|---|
| 9,703,494 B1 | 7/2017 | Rajwade | |
| 2005/0185470 A1 | 8/2005 | Suzuki | |
| 2008/0084747 A1* | 4/2008 | Hemink | G11C 7/1006 |
| | | | 365/185.18 |
| 2008/0158968 A1 | 7/2008 | Moogat | |
| 2011/0182121 A1 | 7/2011 | Dutta | |
| 2013/0170293 A1 | 7/2013 | Sprouse | |
| 2016/0163382 A1 | 6/2016 | Conley | |
| 2017/0046220 A1 | 2/2017 | Sharon | |

FOREIGN PATENT DOCUMENTS

| | | |
|---|---|---|
| CN | 1658329 A | 8/2005 |
| CN | 101553877 A | 10/2009 |
| CN | 102754165 A | 10/2012 |
| CN | 105679364 A | 6/2016 |
| CN | 108140407 A | 6/2018 |
| WO | 2018063901 A1 | 4/2018 |

* cited by examiner

*Primary Examiner* — Jason Lappas
(74) *Attorney, Agent, or Firm* — Winston Hsu

(57) ABSTRACT

A flash memory device includes: a flash memory array; and control logic. The control logic is coupled to the flash memory array. The control logic is arranged to: program a plurality of memory cells of the flash memory array according to at least one first page of data in a first programming pass; sense the memory cells that are programmed in the first programming pass to obtain the at least one first page of data and preserve the at least one first page of data in a first register circuit inside the flash memory device before a second programming pass; and program the memory cells according to the at least one first page of data and a second page of data in the second programming pass.

12 Claims, 7 Drawing Sheets

PRE-READ TECHNIQUE FOR MULTI-PASS PROGRAMMING OF FLASH MEMORY

CROSS REFERENCE TO RELATED APPLICATIONS

The present application is a continuation of International Application No. PCT/CN2018/120030, filed Dec. 10, 2018. The present application is based on and claims priority to International Application No. PCT/CN2018/120030, filed Dec. 10, 2018, the contents of which are hereby incorporated by reference in their entirety.

BACKGROUND OF THE INVENTION

1. Field of the Invention

The present invention relates to flash memory, and more particularly, to a multi-pass programming with a pre-read feature for use in flash memory devices.

2. Description of the Prior Art

In a state-of-the-art flash memory device, multi-level memory cells each can record information of multiple bits. A state of information stored in a memory cell is determined and distinguished by a threshold voltage of the memory cell which is a minimum voltage to be applied between a control gate and a source terminal of a transistor included in the memory cell to switch the transistor to be turned on.

In the conventional art, multi-level memory cells may be programmed through more than one programming passes to improve data reliability. The first programming pass programs one or more lower page(s)/bit(s) in a group of memory cells and one or more subsequent programming passes program the higher pages(s)/bit(s) in the same group of memory cells.

Taking a two-pass programming applied to a quad-level cell (QLC) flash memory device as an example, before the first programming pass, a host controller provides lower page (LP) of data, middle page (MP) of data and upper page (UP) of data to the flash memory device in order to program memory cells thereof so as to obtain a triple-level cell (TLC) distribution in the memory cells. Accordingly, before the second programming pass, the host controller has to provide extra page (XP) of data as well as re-send or restore the LP, MP and UP of data again to program the memory cells so as to obtain a QLC distribution in the memory cells.

In the conventional art, there are two approaches for re-sending or restoring the LP, MP and UP of data before the second programming pass. In a first approach, the host controller may be configured to have a data buffer for preserving information (i.e., LP, MP and UP of data) that has been programmed to the flash memory array in the first programming pass. Accordingly, before the second programming pass, the host controller will re-send the LP, MP and UP of data preserved in the data buffer to the flash memory device again. In a second approach, the host controller does not have the data buffer. Instead, the host controller issues read commands and page buffer movement commands to the flash memory device. According to the read commands, the flash memory device will perform sensing operations to read out information (i.e., LP, MP and UP of data) that has been programmed to the flash memory array in the first programming pass. Then, the LP, MP and UP of data will be moved to internal registers of the flash memory device according to the page buffer movement commands and wait to be programmed in the second programming pass.

In the first approach, the throughput of the interface between the host controller and the flash memory device is not so efficiency because the LP, MP and UP of data is repeatedly transferred over the interface. In the second approach, the read commands will introduce a series of power down, power up and recover operations on memory cells thereby degrades the read performance of the flash memory device. Therefore, there is a need to provide a solution to address the above-mentioned problems.

SUMMARY OF THE INVENTION

With this in mind, it is one object of the present invention to provide a two-pass programming with a pre-read feature. The present invention introduces a pre-read operation that is performed by the flash memory device itself. Such pre-read operation is performed before the second programming pass, thereby to recover the data that has been programmed into the memory cells in a first programming pass such that the host controller does not need to re-send the data or read commands and page buffer movement commands to the flash memory device before the second programming pass.

According to one embodiment, a flash memory device is provided. The flash memory device comprises: a flash memory array; and control logic. The control logic is coupled to the flash memory array and arranged to: program a plurality of memory cells of the flash memory array according to at least one first page of data in a first programming pass; sense states of the memory cells that are programmed in the first programming pass to obtain the at least one first page of data and preserve the at least one first page of data in a first register circuit inside the flash memory device before a second programming pass; and program the memory cells according to the at least one first page of data and a second page of data in the second programming pass.

According to one embodiment, a method for performing a two-pass programming in a flash memory device is provided. The flash memory device has a flash memory array and control logic. The method comprises: programming a plurality of memory cells of the flash memory array according to at least one first page of data in in a first programming pass; sensing states of the memory cells that are programmed in the first programming pass to obtain the at least one first page of data and preserving the at least one first page of data in a first register circuit inside the flash memory device before a second programming pass; and programming the memory cells according to the at least one first page of data and a second page of data in the second programming pass.

These and other objectives of the present invention will no doubt become obvious to those of ordinary skill in the art after reading the following detailed description of the preferred embodiment that is illustrated in the various figures and drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
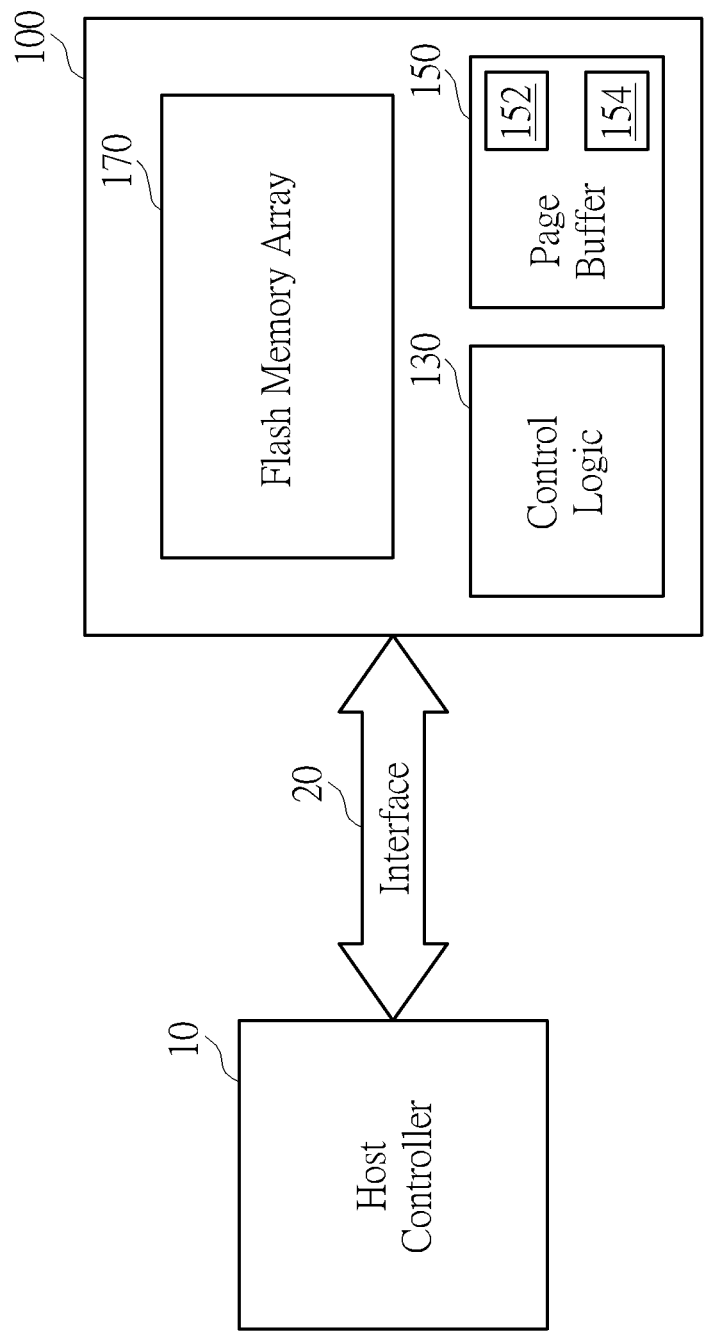
FIG. 1 is a block diagram illustrating a flash memory device according to one embodiment of the present invention.

FIG. 1 illustrates a block diagram of a flash memory device 100 according to one embodiment of the present invention. The flash memory device 100 is controlled by a host controller 10 through an interface 20. The host controller 10 is operable to control read, program, erase operations of the flash memory device 100 by sending commands and/or data through the interface 20. The flash memory device 100 comprises a control logic 130, a page buffer 150 and a flash memory array 170.

Figure 2:
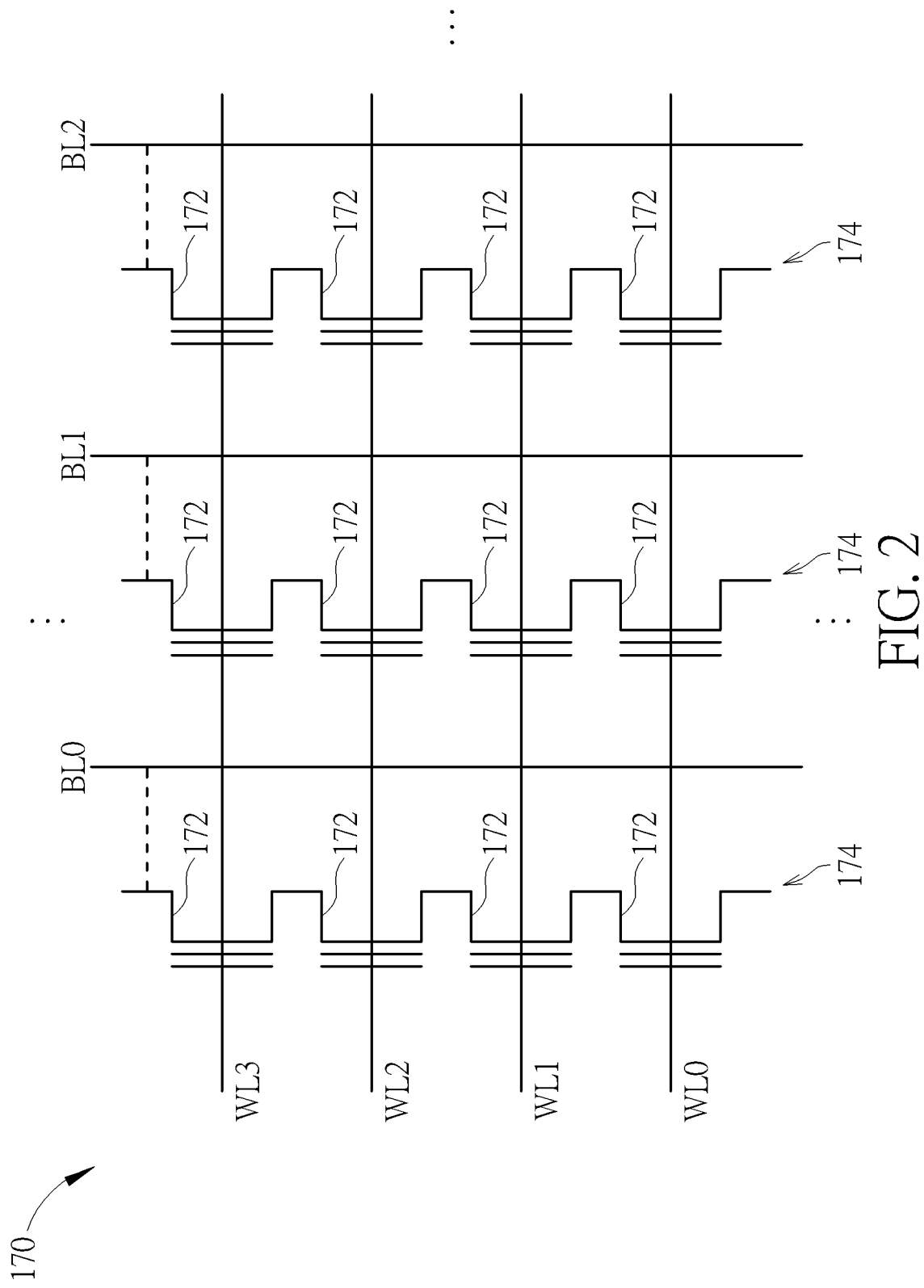
FIG. 2 is a detailed diagram illustrating a flash memory array according to one embodiment of the present invention.

According to one embodiment of the present invention, the flash memory array 170 may comprise a plurality of flash memory cells 172 that are deployed in array arrangement as shown by FIG. 2. Each of the memory cells 172 may comprise a transistor with a floating gate that stores charge that indicates one or more bit values stored by the memory cells 172. The memory cells 172 are coupled in form of multiple series strings 174, wherein drains of the memory cells 202 are each coupled to a source of another memory cell 172. Please note that selection gates, sensing circuitry and address decoders, driving circuits and other supporting logic/circuits are omitted here for sake of brevity.

The flash memory array 170 includes word lines WL0-WLN. Each of word lines WL0-WLN may be connected to control gates of each memory cell 172 of a row of the flash memory array 170 and utilized to bias the control gates of the memory cells 172 in the row. The flash memory array 170 includes bit lines BL0-BLK. Each of the bit lines BL0-BLK is coupled to a series string 174 and coupled to the page buffer 150. The sensing circuitry (not shown) is controlled by the control logic 130 to detect the states of each memory cells 172 by sensing voltage or current on a particular bit line 174.

Figure 3:
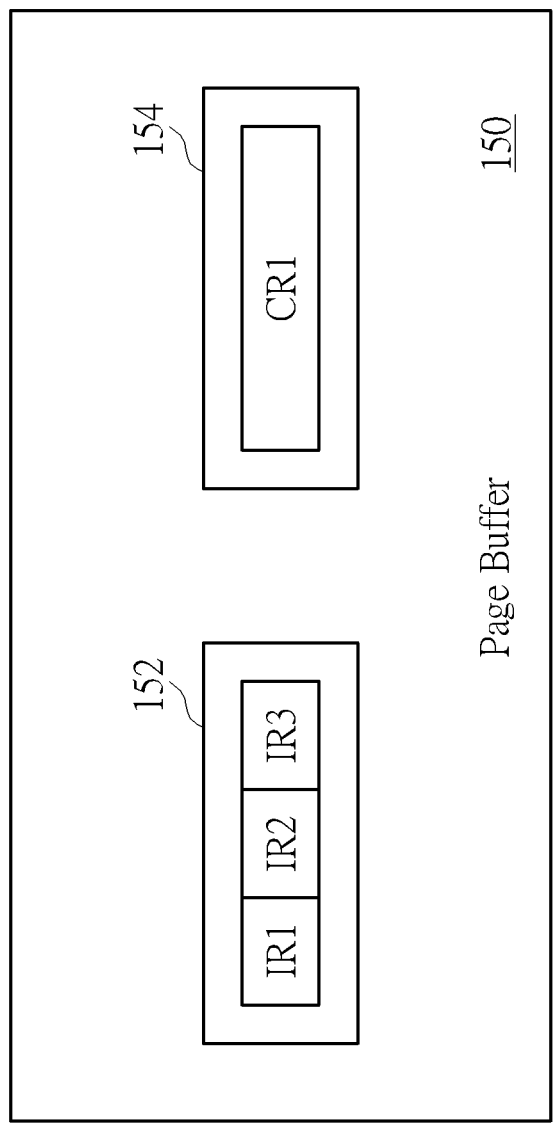
FIG. 3 is a block diagram illustrating a block diagram of a page buffer according to one embodiment of the present invention.

According to various embodiments, each of the memory cells 172 can be programmed according to a single-level cell (SLC), a multi-level cell (MLC), triple-level cell (TLC), a quad-level cell (QLC), or other encoding schemes. Levels of the threshold voltage of the memory cells 172 are indicative of the data that is stored therein. In a preferred embodiment, the memory cells 172 are intended to be programmed to have a QLC distribution. The control logic 130 is operable to program data in one or more memory cells 172 in the flash memory array 170 or read data stored in one or more memory cells 172 in the flash memory array 170 by applying certain voltage to the word lines WL0-WLN. Typically, data to be programmed or read from the memory cells 172 will be placed in one registers CR1 in a second register circuit 154 of the page buffer 150 as shown by FIG. 3. The data to be programmed will be placed in the cache register CR1 in the second register circuit 154 before it is programmed to the flash memory array 170 through the control logic 130. On the other hand, the data read out from the flash memory array 170 through the control logic 130 will be placed in the one register CR1 in the second register circuit 154 before it is returned to the host controller 10.

Figure 4:
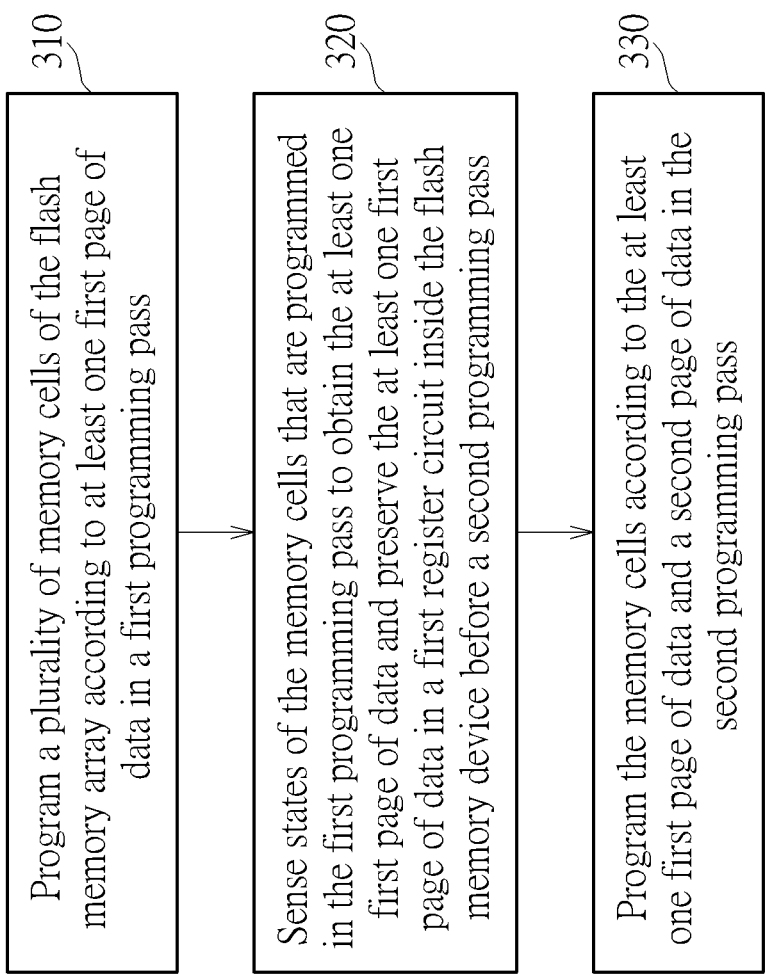
FIG. 4 is a flowchart illustrating a two-pass programming with a pre-read feature according to one embodiment of the present invention.

FIG. 4 illustrates a flow chart regarding a two-pass programming with pre-read operations according to one embodiment of the present invention.

At step 310, the host controller 10 sends a program command and an LP of data, an MP of data and an UP of data to the flash memory device 100 through the interface 20 in order for a first programming pass. Accordingly, the control logic 130 of the flash memory device 100 is configured to program the memory cells 172 of the flash memory array 170 whose word lines are selected in accordance with the program command and the LP of data, the MP of data, and the UP of data. As a subsequence, a TLC distribution can be obtained in the programmed memory cells 172, where the TLC distribution may be under 2-3-2 gray coding scheme.

At step 320, a pre-read operation is performed. After the LP of data, the MP of data, and the UP of data are programmed into the memory cells 172 whose word lines are selected, the control logic 130 is operable to automatically (i.e., without read commands from the host controller 10) perform a pre-read operation to sense information storing states of the memory cells 172 that are programmed in the first programming pass, which represents the LP of data, the MP of data, and the UP of data, respectively. Subsequently, the LP of data, the MP of data, and the UP of data are directly sensed to a first register circuit 152 of the page buffer 150 as shown by FIG. 3. In a preferred embodiment, the first register circuit 152 includes three internal register IR1, IR2, and IR3, which are respectively employed for storing the LP of data, the MP of data, and the UP of data that are sensed from the programmed memory cells 172 through the pre-read operation.

At step 330, the host controller 20 sends an extra page (XP) of data to the control logic 130 to implement a second programming pass. Accordingly, the control logic 130 is configured to program the memory cells 172 according to the LP of data, the MP of data, and the UP of data preserved in the internal register IR1-IR3 in the first register circuit 152 as well as program the memory cells 172 according to the XP of data sent by the host controller 10 in. As a result, a QLC distribution can be obtained in the programmed memory cells 172.

Figure 5:
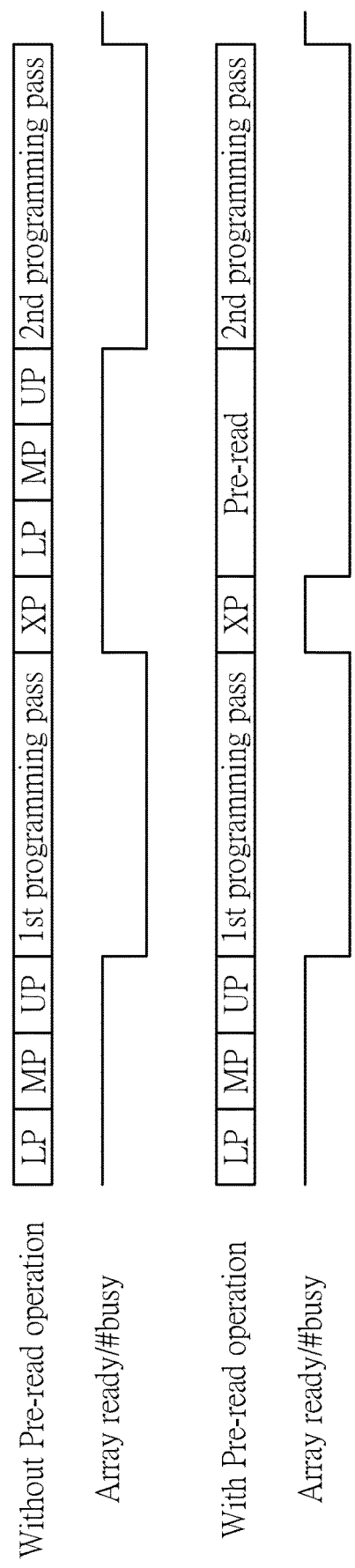
FIG. 5 is a timing chart illustrating difference between performing multi-pass programming with and without pre-read operations according to one embodiment of the present invention.

FIG. 5 illustrates timing charts regarding performing two-pass programming with or without a pre-read operation. The upper timing chart shows how a conventional flash memory device operates to implement a two-pass programming without pre-read operations. As can be seen, after a first programming pass, the flash memory array will be busy since the flash memory array needs to receive the LP of data, the MP of data and UP of data from the host controller again or receives a normal read command to read the LP of data, the MP of data and UP of data, in order to implement a second programming pass.

The lower timing chart shows how the flash memory device 100 of the present invention operates to implement the two-pass programming with pre-read operations. Compared to the conventional art, after the first programming pass, the control logic 130 does need to receive the LP of data, the MP of data and UP of data from the host controller 20 to implement a second programming pass since the control logic 130 has performed pre-read operations to recover the received and programmed LP of data, the MP of data and UP into the internal registers in the first register circuit 152.

Figure 6:
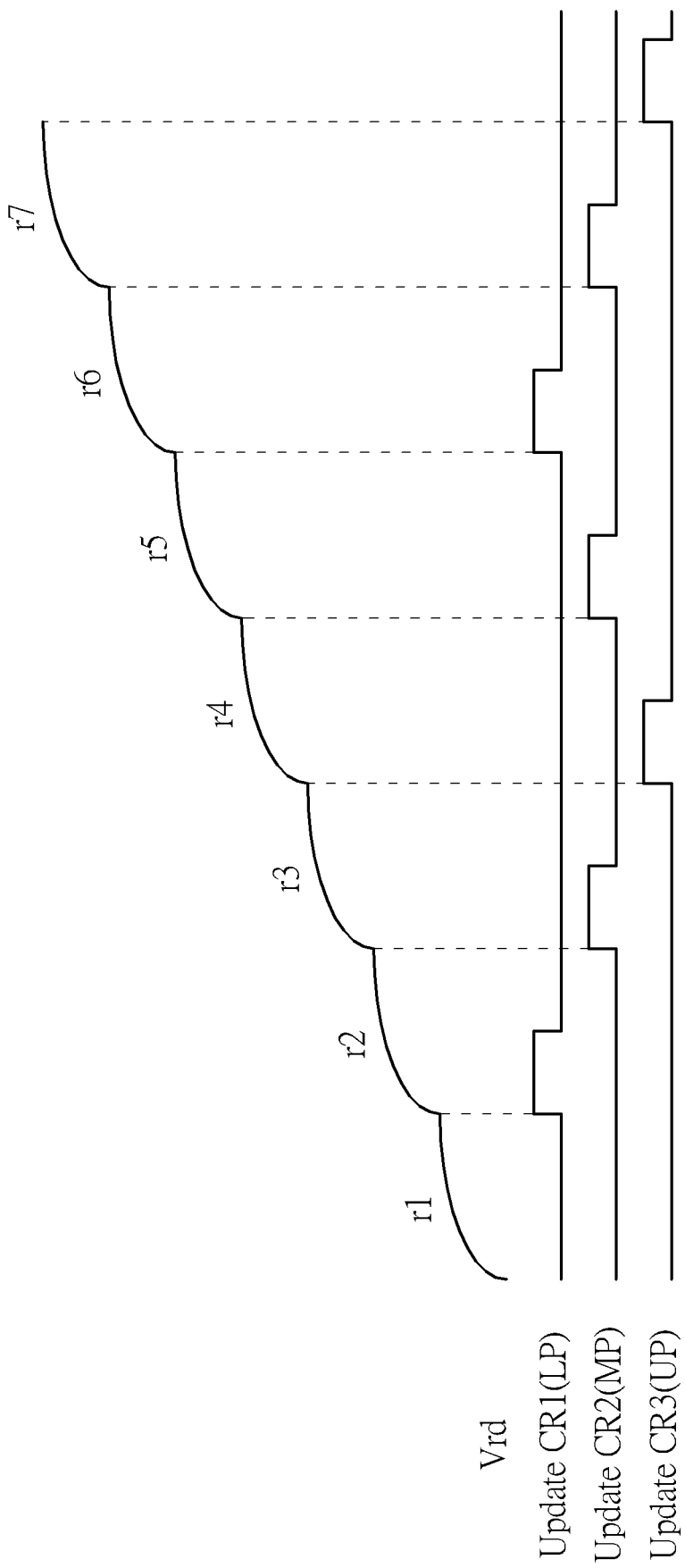
FIG. 6 is a diagram illustrating how a flash memory device of the present invention hides the buffer movement operations during the analog time.

FIG. 6 is a diagram that illustrates that voltage levels applied to a selected word line when sensing information storing states of the memory cells 172 with multi-ramping sense technique. A word line voltage Vrd is supplied to one selected word line of the word lines WL0-WLN. As shown by drawing, the word line voltage Vrd is gradually increased to reach 7 different levels r1-r7 in order to sense 8 possible information storing states regarding the MLC distribution that are programmed in the memory cells 172 in the first programming pass.

For the sensing operation of the LP of data, voltage levels r1 and r5 of the word line voltage Vrd are used. When the voltage levels r1 or r5 are reached, the sensed information storing states of the memory cells 172 will be directly loaded and latched into the internal register IR1. For the sensing operation of the MP of data, voltage levels r2, r4 and r6 of the word line voltage Vrd may be used. When the voltage levels r2, r4 or r6 are reached, the sensed information storing states of the memory cells 172 will be directly loaded and latched into the internal register IR2. For the sensing operation of the UP of data, voltage levels r3 and r7 of the word line voltage Vrd are used. When the voltage levels r3 or r7 are reached, the sensed information storing states of the memory cells 172 will be directly loaded and latched into the internal register IR3.

Once the sensed information regarding the LP of data that is sensed at the voltage level r1 is obtained, it will be directly loaded to the internal register IR1 of the first register circuit 152 before the LP of data is again sensed at the voltage level r5. Once the sensed information regarding the MP of data that is sensed at the voltage level r2 is obtained, it will be directly loaded to the internal register IR2 of the first register circuit 152 before the MP of data is again sensed at the voltage level r4. Once the sensed information regarding the UP of data that is sensed at the voltage level r3 is obtained, it will be directly loaded to the internal register IR3 of the first register circuit 152 before the UP of data is again sensed at the voltage level r7. Therefore, the page buffer movement operations inside the page buffer 150 can be hidden during the analog time, i.e., the time when the word line voltage Vrd is increased between different levels.

Figure 7:
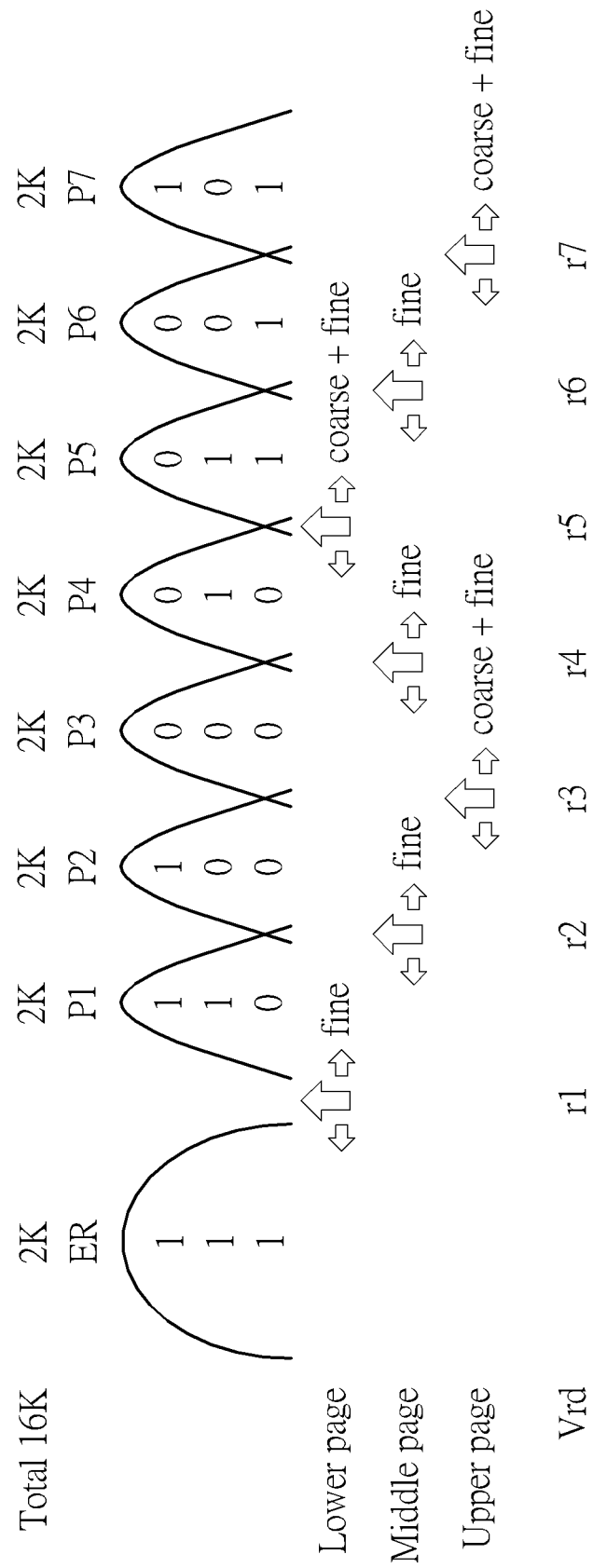
FIG. 7 is a diagram illustrating read window budget (RWB) loss.

Moreover, the present invention utilizes a multi-ramping sense technique to implement the pre-read operations as illustrated in FIG. 6. That is, the word line voltage Vrd on the selected word line is increased step by step until it reaches the highest voltage level r7. Compared to the normal read operation performed in the conventional design, the present invention does not need to perform a series of operations, i.e., power up, power down and recover operations on the memory cells 172 that have been programmed in the first programming pass in order to read out the LP, MP and UP of data. Hence, the pre-read operations performed by the present invention will be faster than the normal read operation that is employed in the conventional design. Furthermore, the normal read operations typically rely upon coarse and fine searches in sensing storing states of the memory cells in order to prevent a read window budget (RWB) loss caused by ground bounce. Please refer to FIG. 7 for better understandings. FIG. 7 illustrates a QLC distribution according to a 2-3-2 gray coding scheme. In a normal read operation, it relies on coarse and fine searches to sense the information storing states ER and P1-P7 of the memory cells at certain word line voltage level. For example, when reading lower page of data (LP), it needs to perform a coarse and fine search to distinguish the information storing states P5-P7 from P1-P4 (i.e., at word line voltage level r5). Then, it needs to perform a fine search to distinguish the information storing states ER from P1-P4. For reading upper page of data (UP), it needs to perform a coarse and fine search to distinguish the information storing states ER and P1-P2 from P3-P7 (i.e., at word line voltage level r3). Then, it needs to perform a coarse and fine search to distinguish the information storing states P3-P6 from P7 (i.e., at word line voltage level r7). The reason why the normal read operations rely on coarse searches is that the normal read operations involves discharging more than 4K bit lines. Hence, it is necessary to perform coarse searches in sensing storing states of the memory cells to reduce RWB loss from ground bounce. However, in the present invention, as the multi-ramping sense technique is applied, there are only 2K bit lines discharged at each word voltage level for reading a 16K page of data. Therefore, the coarse searches are not used in sensing states of memory cells. Since the coarse searches are performed in the normal read operations, it takes more time than the pre-read operation of the present invention and has relatively poor performance.

In addition, there are still some advantages of the pre-read operations of the present invention over the conventional art. In the above-mentioned first approach of the conventional art where the host controller re-sends the LP, MP, UP of data to the flash memory device before a second programming pass, cache will enter a busy state when moving the LP, MP, UP of data from cache registers to internal registers. For example, before a second programming pass, LP of data will be sent from the host controller to the flash memory device and stored in the cache register. Then, the LP of data will be later moved from a cache register to an internal register, which causes cache to be in the busy state (as can be also seen from the upper timing chart of FIG. 5). Similarly, MP/UP of data will be also sent from the host controller to the flash memory device and stored in the cache register before the second programming pass. When the MP/UP of data is moved from the cache register to the internal register, the cache register will be again in the busy state. Hence, cache has a significantly long busy time in the first approach of the conventional art (as can be also seen from the upper timing chart of FIG. 5.

In the second approach, the host controller issues read commands and page buffer movement commands to the flash memory device to recover the LP, MP and UP of data before a second programming pass. Each time a read operation is performed by the flash memory device according to the read command, the sensed data will be firstly latched in a cache register. Then, the host controller issue a page buffer movement command to the flash memory device, thereby to move the sensed data from the cache register to an internal register. For example, the host controller issues a read command to sense LP of data that has been programmed in the flash memory array. Accordingly, the sensed LP of data will be latched in a cache register and later the host controller will issue a page buffer movement command to move the sensed LP of data from the cache register to an internal register, which causes cache in a busy state (as can be seen from the upper timing chart of FIG. 5. Similarly, the host controller also issues read commands to sense MP/UP of data that has been programmed in the flash memory array. Accordingly, the sensed MP/UP of data will be latched in the cache register and later the host controller will issue a page buffer movement command to move the sensed MP/UP of data from the cache register to the internal register, which also causes cache in the busy state. Hence, cache still has a significantly long busy time in the second approach of the conventional art (as can be seen from the upper timing chart of FIG. 5.

In contrast to the above-mentioned approaches in the conventional art, the pre-read operation of the present invention allows the LP, MP and UP data directly to be sensed to the internal registers IR1-IR3 of the page buffer 150. Hence, the page buffer movement operations can be saved and cache of the page buffer 150 will have significantly short busy time compared to the above-mentioned approaches in the conventional art (as can be also seen from the lower timing chart of FIG. 5).

In conclusion, compared to the first approach used in the conventional art where the host controller needs to again send the information has been programmed in the first programming pass, the present invention saves external storage buffer required by the host controller to keep the sent data and improves the throughput efficiency. Compared to the second approach used in the conventional art where the host controller needs to send read commands and page buffer movement commands to sense the data has been programmed in the first programming pass, the present invention shortens the time required by sensing the programmed data from the memory cells through normal read operations. Hence, the present invention significantly improves the efficiency and performance of the two-pass programming of the flash memory devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory device, comprising:
a flash memory array;
a control logic, coupled to the flash memory array, and arranged to:
program a plurality of memory cells of the flash memory array according to at least one first page of data in a first programming pass;
sense states of the memory cells that are programmed in the first programming pass to obtain the at least one first page of data and preserve the at least one first page of data in a first register circuit inside the flash memory device before a second programming pass; and
program the memory cells according to the at least one first page of data and a second page of data in the second programming pass.

2. The flash memory device of claim 1, wherein the control logic is configured to program the memory cells according to a lower page of data, a middle page of data and an upper page of data in the first programming pass.

3. The flash memory device of claim 2, wherein the control logic is configured to sense the lower page of data, the middle page of data and the upper page of data from the memory cells that are programmed in the first programming pass and preserve the lower page of data, the middle page of data and the upper page of data in the first register circuit before the second programming pass.

4. The flash memory device of claim 3, wherein in the second programming pass, the control logic is configured to program the memory cells according to the lower page of data, the middle page of data and the upper page of data preserved in the first register circuit and program the memory cells according to an extra page of data sent from a host controller.

5. The flash memory device of claim 3, wherein the flash memory device has a second register circuit, and before the first programming pass, the flash memory device receives the at least one first page of data from a host controller and stores the at least one first page of data to the second register circuit; and before the second programming pass, the flash memory device obtains the at least one first page of data sensed from the memory cells and directly stores the sensed at least one first page of data to the first register circuit.

6. The flash memory device of claim 3, wherein the control logic is configured to sense the lower page of data, the middle page of data and the upper page of data from the memory cells that are programmed in the first programming pass in a multi-ramping sense manner.

7. A method for performing a two-pass programming in a flash memory device having a flash memory array and control logic, the method comprising:
programming a plurality of memory cells of the flash memory array according to at least one first page of data in in a first programming pass;
sensing the memory cells that are programmed in the first programming pass to obtain the at least one first page of data and preserving the at least one first page of data in a first register circuit inside the flash memory device before a second programming pass; and
programming the memory cells according to the at least one first page of data and a second page of data in the second programming pass.

8. The method of claim 7, wherein the step of programming the memory cells according to the at least one first page of data in the first programming pass comprises:

programming the memory cells according to a lower page of data, a middle page of data and an upper page of data in in the first programming pass.

9. The method of claim 8, wherein the step of sensing the memory cells and preserve the at least one first page of data before the second programming pass comprises:

sensing the lower page of data, the middle page of data and the upper page of data from the memory cells that are programmed in the first programming pass; and preserving the lower page of data, the middle page of data and the upper page of data in the first register circuit before the second programming pass.

10. The method of claim 9, wherein the step of programming the memory cells according to the at least one first page of data and the second page of data in the second programming pass comprises:

in the second programming pass, programming the memory cells according to the lower page of data, the middle page of data and the upper page of data preserved in the first register circuit; and programming the memory cells according to an extra page of data sent from a host controller.

11. The method of claim 9, wherein the flash memory device has a second register circuit, and the method further comprises:

before the first programming pass, receiving the at least one first page of data from a host controller and storing the at least one first page of data to the second register circuit; and before the second programming pass, obtaining the at least one first page of data sensed from the memory cells and directly storing the sensed at least one first page of data to the first register circuit.

12. The method of claim 9, wherein the step of sensing the lower page of data, the middle page of data and the upper page of data comprising:

sensing the lower page of data, the middle page of data and the upper page of data that are programmed in the first programming pass in a multi-ramping sense manner.

\* \* \* \* \*